(12) United States Patent
Matsui et al.

(10) Patent No.: US 8,169,129 B2
(45) Date of Patent: May 1, 2012

(54) METAL LAMINATED BODY, LED-MOUNTED SUBSTRATE, AND WHITE FILM

(75) Inventors: Jun Matsui, Shiga (JP); Shingetsu Yamada, Shiga (JP); Shuuji Suzuki, Shiga (JP)

(73) Assignee: Mitsubishi Plastics, Inc., Tokyo (JP)

( * ) Notice: Subject to any disclaimer, the term of this patent is extended or adjusted under 35 U.S.C. 154(b) by 99 days.

(21) Appl. No.: 12/744,560

(22) PCT Filed: Nov. 28, 2008

(86) PCT No.: PCT/JP2008/071637
§ 371 (c)(1),
(2), (4) Date: Aug. 6, 2010

(87) PCT Pub. No.: WO2009/069741
PCT Pub. Date: Jun. 4, 2009

(65) Prior Publication Data
US 2010/0301725 A1 Dec. 2, 2010

(30) Foreign Application Priority Data
Nov. 29, 2007 (JP) .................................. 2007-309035

(51) Int. Cl.
*H01J 5/16* (2006.01)
*H01L 33/00* (2010.01)
(52) U.S. Cl. ......... 313/113; 313/498; 524/497; 524/449
(58) Field of Classification Search .................. 313/110, 313/113, 498, 512; 524/497, 447, 449
See application file for complete search history.

(56) References Cited

U.S. PATENT DOCUMENTS

| | | | | |
|---|---|---|---|---|
| 4,763,133 A | * | 8/1988 | Takemura et al. | 343/912 |
| 2007/0161741 A1 | * | 7/2007 | Ogasawara | 524/494 |
| 2009/0095969 A1 | * | 4/2009 | Kotani et al. | 257/98 |

FOREIGN PATENT DOCUMENTS

| | | |
|---|---|---|
| JP | 2002 294070 | 10/2002 |
| JP | 2003 185813 | 7/2003 |
| JP | 3470730 | 9/2003 |
| JP | 2005 86075 | 3/2005 |
| JP | 2006 257314 | 9/2006 |
| JP | 2007 2096 | 1/2007 |
| JP | 2007 131842 | 5/2007 |
| JP | 2007 218980 | 8/2007 |
| WO | 2005 088736 | 9/2005 |

* cited by examiner

*Primary Examiner* — Karabi Guharay
(74) *Attorney, Agent, or Firm* — Oblon, Spivak, McClelland, Maier & Neustadt, L.L.P.

(57) ABSTRACT

The present invention provides a white film comprising a thermoplastic resin composition containing 25-100 parts by mass of an inorganic filler based on 100 parts by mass of a thermoplastic resin, wherein the average reflectance at a wavelength of 400-800 nm is 70% or more, the average linear expansion coefficient in the machine direction and the transverse direction is $35 \times 10^{-6}/°$ C. or less, and the decreasing rate in reflectance at a wavelength of 470 nm after thermal treatment at 200° C. for 4 hours is 10% or less; and the invention provides a metal laminated body. These exhibit high thermal resistance, high reflectance within visual light range, and small decrease in reflectance under a high heat load environment, but also be applicable for a large sized printed circuit boards for mounting LEDs.

17 Claims, 3 Drawing Sheets

METAL LAMINATED BODY, LED-MOUNTED SUBSTRATE, AND WHITE FILM

TECHNICAL FIELD

The present invention relates to: a white film which exhibits excellent thermal resistance, reduced anisotropy, and high reflectance characteristics; a metal laminated body employing the white film; and a LED-mounted substrate. More particularly, the invention relates to: a white film of which decrease in reflectance is inhibited even under a high heat load environment and which enables mounting of e.g. light emitting diode (LED); a metal laminated body employing the white film; and a LED-mounted substrate.

BACKGROUND ART

A chip-type LED where elements are directly mounted on the pattern of a printed circuit boards and sealed with resin is advantageously used for smaller-sized and lower-profile products; so, it has been used for wide range of electronic devices such as lighting of numerical keypad for cellular phone and back-lighting of small-sized liquid crystal display.

In recent years, technological development of highly bright LED is significant and brightness of the LEDs is becoming higher; with this development, the calorific value of the LED element itself increases and the heat load given at the periphery of the printed circuit boards and so on also is increasing. Therefore, in fact, some LED elements have a periphery temperature of above 100° C. Moreover, in the fabricating process of LED-mounted substrate, thermosetting treatment of sealing resin and lead (Pb)-free solder have been adopted; so, in the reflow step, the LED elements are sometimes exposed under a high heat load environment such as a case of about 260° C. to about 300° C. In such a heat load environment, a conventionally used white printed circuit boards made of a thermoset resin composition tends to show decrease in whiteness due to the discolor into yellow whereby show poor reflection efficiency. Therefore, there is still a room for improvement about future substrates for mounting next-generation highly bright LED. On the other hand, although ceramic substrate is excellent in thermal resistance, due to its hard and brittle properties, there is limitation of using ceramic substrate for a larger-size and lower-profile product; hence, it may become difficult to be used for future general lighting and substrate for display. Accordingly, development of a white printed circuit board, which does not discolor and does not decrease its reflectance under a high heat load but does have a thermal resistance and which is applicable for a larger-sized product, has been required.

To the above issues, Patent document 1 discloses a thermoplastic resin composition comprising 100 parts by mass of a thermoplastic resin, 0.001-10 parts by mass of a specific silicon compound, and 0.05-25 parts by mass of titanium oxide of which average particle diameter is 0.05-1.0 μm and crystalline shape is rutile structure and the surface of which is treated by at least one compound selected from alumina hydrate or hydrated silicates. Patent document 1 states that the molded product made of the thermoplastic resin composition (specifically, a rectangle plate having a size of 100 mm×100 mm×2 mm and being obtained by injection molding of the thermoplastic resin composition) has a reflectance as high as about 90% and exhibits excellent dispersiveness, surface appearance, and mechanical strength, and is suitably used for a wide range of industrial field.

Patent document 2 discloses a reflector, which does not require complex fabricating steps but does show a high reflectance and have a surface roughness of 0.5-50 μm, and which is used for e.g. a lighting and a display device, the reflector comprises a resin composition comprising: a crystalline resin; a white pigment having an average particle diameter of 0.05-5 μm, and an inorganic filler having an average particle diameter of 0.5 μm to 10 mm. The examples thereof may be a rectangle plate having a size of 3 cm×3 cm×1 mm and being obtained by injection molding of a resin composition containing a polyaryl ketone, titanium oxide, and a glass fiber.

In addition, Patent document 3 discloses a polyamide resin composition for forming LED reflector, which comprising: 5-100 parts by mass of titanium oxide; 0.5-30 parts by mass of magnesium hydroxide; and 20-100 parts by mass of reinforcing agent such as fiber-type filler and needle-type filler, based on 100 parts by mass of a specific polyamide resin. Specifically, it shows a plate having a size of 1 mm in thickness, 40 mm in width, and 100 mm in length and being obtained by injection molding of the polyamide resin composition. The reflector made of the resin composition can maintain high whiteness without reducing the reflectance even under a heat load of 170° C. for 2 hours.

Further, Patent document 4 discloses a prepreg comprising a substrate and a resin composition containing a cyanic acid ester compound, novolac-type epoxy resin, and titanium dioxide, and a copper-clad laminate.

Patent Document 1: Japanese Patent No. 3470730
Patent Document 2: Japanese Patent Application Laid-Open (JP-A) No. 2007-218980
Patent Document 3: JP-A No. 2006-257314
Patent Document 4: JP-A No. 2007-131842

DISCLOSURE OF THE INVENTION

Problems to be Solved by the Invention

Although the above Patent documents 1 to 3 show molded products having a higher reflectance by adding titanium oxide to a thermoplastic resin composition, each of which only shows molded products obtained by injection molding but does not show a white film of which thermal resistance has been improved. Moreover, with respect to the copper-clad laminate of Patent document 4, although decrease of the reflectance at a heat load of 180° C. for one hour is inhibited (reduced from 80% to 64%) compared with the conventional substrate, in view of development of LEDs having higher brightness and Pb-free soldering reflow process, the thermal resistant at a higher heat environment is not sufficient.

Accordingly, an object of the present invention is to provide a white film which exhibits high thermal resistance, high reflectance within visual light range, and small decrease in reflectance under high heat load environment, and which can be applicable for a large-sized printed circuit boards for mounting LEDs. Another object of the invention is to provide a metal laminated body and a LED-mounted substrate respectively employing the white film.

Means for Solving the Problems

As a result of intensive study by the inventors, they discovered that even when a reflectance-improved film is produced by adding an inorganic filler such as titanium oxide to a thermoplastic resin, despite the improvement of reflectance, linear expansion coefficient of the film is high and dimensional stability is poor; thereby the film cannot be used as a printed circuit boards for mounting LEDs. In addition, conventionally, as shown in Patent documents 2 and 3, to improve the surface roughness and mechanical strength, a method to adding e.g. a glass fiber, a fibrous filler, and a substantially needle filler to a thermoplastic resin; however, even if a similar inorganic filler to the above filler is used, the dimensional stability is improved but anisotropy tends to occur (linear expansion coefficient in the width direction becomes larger); hence, it is found that it may cause defect when used as a substrate material.

Accordingly, to improve the above problems furthermore, the inventors focused on and studied inorganic filler contained in a thermoplastic resin. As a result, they discovered that by adding a certain inorganic filler to a thermoplastic resin at a predetermined ratio, a white film which exhibits excellent dimensional stability in both the Machine Direction (MD) and the Transverse Direction (TD) can be obtained; and they completed the present invention.

The first aspect of the present invention is a metal laminated body comprising: a white film; and a metal layer being laminated on at least one surface of the white film, wherein the white film comprises a thermoplastic resin composition containing 25-100 parts by mass of an inorganic filler based on 100 parts by mass of the thermoplastic resin, and has: an average reflectance of 70% or more at a wavelength of 400-800 nm; an average linear expansion coefficient of $35 \times 10^{-6}$/° C. or less in the machine direction and the transverse direction; and a decreasing rate in reflectance of 10% or less at a wavelength of 470 nm after thermal treatment at 200° C. for 4 hours.

In the first aspect of the invention, the inorganic filler preferably contains at least a filler having an average particle diameter of 15 μm or less and an average aspect ratio of 30 or more.

In the first aspect of the invention, the inorganic filler preferably contains, based on 100 parts by mass of the thermoplastic resin: 10-85 parts by mass of filler 1 having an average particle diameter of 15 μm or less and an average aspect ratio of 30 or more; and 15-90 parts by mass of filler 2 having a refractive index of 1.6 or more. Moreover, the filler 2 is preferably titanium oxide.

In the first aspect of the invention, the thermoplastic resin preferably contains at least one selected from a crystalline thermoplastic resin of which crystal melting peak temperature is 260° C. or more and an amorphous thermoplastic resin of which glass transition temperature is 260° C. or more.

In the first aspect of the invention, the thickness of the white film is preferably 3-500 μm.

The metal laminated body according to the first aspect of the invention is preferably the one where decreasing rate in reflectance of the white film at a wavelength of 470 nm after thermal treatment at 260° C. for 5 minutes is 10% or less.

The second aspect of the present invention is an LED-mounted substrate employing the metal laminated body according to the first aspect of the invention.

The third aspect of the present invention is an LED-mounted substrate comprising: a metal laminated body according to the first aspect of the invention; a metal radiator; and LEDs, the metal layer in the metal laminated body being provided in a form of wiring pattern, the wiring pattern and the LEDs being connected to each other, and the metal radiator being connected to a surface of the white film opposite to the surface where the wiring pattern is formed.

In the second and third aspects of the invention, the metal laminated body is preferably punched out along a cavity frame.

The fourth aspect of the present invention is a white film comprising a thermoplastic resin composition containing 25-100 parts by mass of an inorganic filler based on 100 parts by mass of a thermoplastic resin, wherein the average reflectance at a wavelength of 400-800 nm is 70% or more, the average linear expansion coefficient in the machine direction and the transverse direction is $35 \times 10^{-6}$/° C. or less, and the decreasing rate in reflectance at a wavelength of 470 nm after thermal treatment at 200° C. for 4 hours is 10% or less.

In the fourth aspect of the invention, the inorganic filler preferably contains at least a filler having an average particle diameter of 15 μm or less and an average aspect ratio of 30 or more.

In the fourth aspect of the invention, the inorganic filler preferably contains, based on 100 parts by mass of the thermoplastic resin: 10-85 parts by mass of filler 1 having an average particle diameter of 15 μm or less and an average aspect ratio of 30 or more; and 15-90 parts by mass of filler 2 having a refractive index of 1.6 or more.

In the fourth aspect of the invention, the filler 2 is preferably titanium oxide.

In the fourth aspect of the invention, the thermoplastic resin preferably contains at least one selected from a crystalline thermoplastic resin of which crystal melting peak temperature is 260° C. or more and an amorphous thermoplastic resin of which glass transition temperature is 260° C. or more.

In the fourth aspect of the invention, the thickness of the film is preferably 3-500 μm.

In the fourth aspect of the invention, the decreasing rate in reflectance of the white film at a wavelength of 470 nm after thermal treatment at 260° C. for 5 minutes is preferably 10% or less.

EFFECTS OF THE INVENTION

According to the present invention, it can provide a white film and a metal laminated body, these of which exhibit high thermal resistance, excellent dimensional stability, high reflectance within visual light range, and small decrease in reflectance under high heat load environment; due to the properties, these can be suitably used for a printed circuit boards for mounting LEDs.

DESCRIPTION OF THE REFERENCE NUMERALS

| | |
|---|---|
| 10 | copper foil |
| 20 | wiring pattern (conductor pattern) |
| 30 | bonding wire |
| 100 | white film |
| 200 | LED |
| 300 | aluminum plate |

BEST MODE FOR CARRYING OUT THE INVENTION

Hereinafter, the present invention will be described by way of the following embodiment; however, the invention is not particularly limited to the embodiments.

<White Film>

As a white film of the present invention, the white film is not particularly limited as long as the film comprises a thermoplastic resin composition containing 25-100 parts by mass of an inorganic filler based on 100 parts by mass of a thermoplastic resin, average reflectance of the white film at a wavelength of 400-800 nm being 70% or more, average linear expansion coefficient of the white film in the machine direction and the transverse direction being $35\times10^{-6}/°$ C. or less, decreasing rate in reflectance of the white film at a wavelength of 470 nm after thermal treatment at 200° C. for 4 hours being 10% or less. By adding the inorganic filler and setting the conditions of: average reflectance of the white film at a wavelength of 400-800 nm being 70% or more; and average linear expansion coefficient of the white film in the machine direction (MD: the direction of film flow) and the transverse direction (TD: the direction orthogonal to the film's flow direction) being $35\times10^{-6}/°$ C. or less, the white film exhibits excellent effect such as good dimensional stability, high reflectance, small decrease in reflectance under high heat load environment. When the linear expansion coefficient exceeds $35\times10^{-6}/°$ C., for example, the film tends to curl or warp when laminated with a metal foil and dimensional stability of the film becomes insufficient. More preferable range of the linear expansion coefficient is depending on the type of metal foil to be used, the circuit pattern to be formed on both surface of the film, and the laminated constitution; it is approximately $10\times10^{-6}/°$ C. to $30\times10^{-6}/°$ C. In addition, the difference of the linear expansion coefficient between the MD and the TD is preferably $20\times10^{-6}/°$ C. or less, more preferably $15\times10^{-6}/°$ C. or less, and particularly preferably $10\times10^{-6}/°$ C. or less. By reducing anisotropy (the difference of the linear expansion coefficient between the MD and TD), there is no worry about curl and warp caused in the direction (MD or TD) showing larger linear expansion coefficient and no worry about insufficiency of dimensional stability.

As above, the white film of the invention requires 70% or more of the average reflectance at a wavelength of 400-800 nm. This is because if the reflectance in the visual light range is higher, the brightness of the LEDs to be mounted tends to become higher; within the above range, the white film can be suitably used as a substrate for mounting white LEDs. Moreover, a white film, which shows higher reflectance around a wavelength of 470 nm corresponding to the average wavelength (470 nm) of the blue LEDs, tends to show higher brightness; therefore, the reflectance at a wavelength of 470 nm is preferably 70% or more, more preferably 75% or more.

(Inorganic Filler)

Examples of the inorganic filler include: talc, mica, glass flake, boron nitride (BN), calcium carbonate, aluminum hydroxide, silica, titanate (e.g. potassium titanate), barium sulfate, alumina, kaolin, clay, titanium oxide, zinc oxide, zinc sulfide, lead titanate, zirconium oxide, antimony oxide, and magnesium oxide. These may be used alone or used in combination of two or more thereof.

To improve dispersiveness into the thermoplastic resin, an inorganic filler of which surface is treated by, for example, a silicon-based compound, a polyvalent alcohol-based compound, an aminic compound, a fatty acid, and a fatty acid ester can be used. Among the fillers, one treated by a silicon-based compound (a silane coupling agent) can be suitably used.

As above, it is important for the white film of the invention to set the average reflectance at a wavelength of 400-800 nm being 70% or more and the average linear expansion coefficient in the MD and TD being $35\times10^{-6}/°$ C. or less; when the values of the reflectance and the linear expansion coefficient are within the range, the inorganic filler to be added is not particularly restricted. Specific method to set the values of the reflectance and the linear expansion coefficient within the above range may be a method using 25-100 parts by mass of an inorganic filler at least containing, based on 100 parts by mass of the thermoplastic resin: filler 1 having an average particle diameter of 15 μm or less and an average aspect ratio [(average particle diameter)/(average thickness)] of 30 or more; and a filler 2 having a larger difference of refractive index from that of the thermoplastic resin as a base resin (the refractive index of the filler 2 is about 1.6 or more). If the dosage of the inorganic filler is less than 25 parts by mass, it becomes difficult to make the balance between the reflectance and the linear expansion coefficient, which is not preferable; while, if the dosage exceeds 100 parts by mass, problems in formability such as lack of dispersiveness of the inorganic filler and rupture of the film are caused during the film forming; thereby it is not preferable. In this way, by adding these fillers (the filler 1 and the filler 2) having a particular properties as inorganic fillers, it is possible to obtain a white film which exhibits favorable reflectance and excellent dimensional stability with no anisotropy. It should be noted that refractive index of the thermoplastic resin is measured in accordance with JIS K-7142 Method-A and the refractive index of the filler 2 is measured in accordance with JIS K-7142 Method-B.

Examples of the filler 1 having an average particle diameter of 15 μm or less and an average aspect ratio [(average particle diameter)/(average thickness)] of 30 or more include: an inorganic scale-type (plate-type) filler such as a synthetic mica, a natural mica (e.g. muscovite, phlogopite, sericite, and suzorite), a calcined natural or synthetic mica, boehmite, talc, illite, kaolinite, montmorillonite, vermiculite, and smectite, and plate-type alumina; and a scale-type titanate. By the filler 1, it is possible to control the linear expansion coefficient ratio at a lower level in the planar direction and the thickness direction. When considering light reflectivity, scale-type titanate is preferable because of its higher refractive index. The filler can be used alone or used in combination of two or more thereof. By using a scale-type filler having a higher aspect ratio, moisture permeability (i.e. moisture adsorption) can be inhibited, oxidation degradation of the thermoplastic resin under a high heat environment can be inhibited, and decrease in reflectance can also be inhibited. Moreover, stiffness of the film improves so that the film can be used for thinner substrate.

The content of the filler 1 based on 100 parts by mass of the thermoplastic resin composition is preferably 10 parts by mass or more, more preferably 20 parts by mass or more, and particularly preferably 30 parts by mass or more. Within the above range, the linear expansion coefficient of the obtained white film can be lowered down to the predetermined range.

The filler 2 is an inorganic filler having a large difference in refractive index from that of the thermoplastic resin as the base resin. As it were, it is preferably an inorganic filler having a larger reflective index: i.e. 1.6 or more as a standard. Specifically, for example, calcium carbonate, barium sulfate, zinc oxide, titanium oxide, and titanate each of which has a refractive index of 1.6 or more may be preferably used; among them, titanium oxide is particularly preferably used.

Titanium oxide shows significantly higher refractive index (namely, about 2.50 or more) compared with other inorganic fillers and enables to enlarge the difference in refractive index from that of the thermoplastic resin as the base resin. Therefore, compared with the cases using other fillers, it is possible to obtain an excellent reflectivity with smaller dosage. Moreover, even when the film is made thinner, it is possible to obtain a white film which exhibits high reflectivity.

Titanium oxide may preferably be a crystalline titanium oxide such as anatase-type or rutile-type titanium oxide; among them, in view of enlarging difference in refractive index from that of the base resin, rutile titanium oxide is preferable.

In addition, method for producing titanium oxide may be chlorine method and sulfuric acid method; in view of whiteness, titanium oxide produced by chlorine method is preferable.

The titanium oxide is preferably the one of which surface is coated with an inactive inorganic oxide. By coating the surface of the titanium oxide with the inactive inorganic oxide, it is capable of inhibiting photocatalytic activity of the titanium oxide; thereby it is possible to inhibit deterioration of the film. Examples of the inactive inorganic oxide may preferably be at least one selected from silica, alumina, and zirconia. When these inactive inorganic oxides are used, it is possible to inhibit decrease of molecular weight and yellowing of the thermoplastic resin without deteriorating its high reflectivity when melting at a high-temperature.

To enhance dispersiveness of the titanium oxide in the thermoplastic resin, the surface of the titanium oxide is preferably treated by at least one inorganic compound selected from, for example, a siloxane compound and a silane coupling agent, or treated by at least one organic compound selected from, for example, polyol and polyethylene glycol. Particularly, in view of thermal resistance, a titanium oxide treated by a silane coupling agent is preferable.

The particle diameter of the titanium oxide is preferably 0.1-1.0 μm, more preferably 0.2-0.5 μm. When the particle diameter of the titanium oxide is within the above range, dispersiveness of the titanium oxide in the thermoplastic resin is favorable so that it is possible to form a dense interface with the thermoplastic resin, whereby high reflectivity can be given.

The content of the titanium oxide based on 100 parts by mass of the thermoplastic resin composition is preferably 15 parts by mass or more, more preferably 20 parts by mass or more, and most preferably 25 parts by mass or more. Within the above range, favorable reflectivity can be obtained; therefore, even when the film becomes thinner, favorable reflective characteristics can be obtained.

As a combination of the filler 1 and the filler 2, to make a balance between the reflectance and the linear expansion coefficient, the above titanium oxide and a scale-type inorganic filler may preferably be mixed at an adequate ratio. The mixing ratio of the filler 1 and the filler 2, based on 100 parts by mass of the thermoplastic resin, may preferably be: 10-85 parts by mass of the filler 1 having an average particle diameter of 15 μm or less and an average aspect ratio of 30 or more; and 15-90 parts by mass of the filler 2 having a refractive index of 1.6 or more. More preferable ratio is 20-75 parts by mass of the filler 1 and 25-80 parts by mass of the filler 2; and particularly preferable ratio is 30-65 parts by mass of the filler 1 and 35-70 parts by mass of the filler 2.

(Thermoplastic Resin)

Examples of the thermoplastic resin include: polyether ether ketone (PEEK), polyether ketone (PEK), polyphenylene sulfide (PPS), polyether sulfone (PES), polyphenylene ether (PPE), polyamide imide (PAI), polyetherimide (PEI), polyphenyl sulfone (PPSU), and liquid crystal polymer (LCP); these may be used alone or in combination of two or more thereof. Among them, in view of thermal resistance, particularly, a thermoplastic resin containing at least one selected from crystalline thermoplastic resins having a crystal melting peak temperature of 260° C. or more and amorphous thermoplastic resins having a glass transition temperature of 260° C. or more is preferably used; a thermoplastic resin consisting of at least one selected from the crystalline thermoplastic resins having a crystal melting peak temperature (Tm) of 260° C. or more and the amorphous thermoplastic resins having a glass transition temperature (Tg) of 260° C. or more is more preferably used. By using the thermoplastic resin within the above range, the thermoplastic resin can have thermal resistance to Pb-free soldering reflow. It is also possible to inhibit oxidation degradation under a high heat environment and possible to inhibit decrease in reflectance. Preferable example of the crystalline thermoplastic resin having a crystal melting peak temperature of 260° C. or more may be: polyether ether ketone (PEEK: Tg=145° C.; Tm=335° C.), polyaryl ketone (PAr) such as polyether ketone (PEK: Tg=165° C.; Tm=355° C.), and polyphenylene sulfide (PPS: Tg=100° C.; Tm=280° C.). Preferable examples of the amorphous thermoplastic resin having a glass transition temperature of 260° C. or more may be: polyamide imide (PAI: Tg=280° C.) and polyetherimide (PEI) having Tg as high as 260° C. or more.

The polyaryl ketone resin is a thermoplastic resin containing, in its structural unit, aromatic nucleus bond, ether bond, and ketone bond. Typical examples thereof include polyether ketone, polyether ether ketone, and polyether ketone ketone; among them, polyether ether ketone is preferable. It should be noted that polyether ether ketone can be commercially available as, for example, "PEEK 151G", "PEEK 381G", and "PEEK 450G" (these are commodity names of the products manufactured by Victrex plc).

The crystalline thermoplastic resin may be used alone or may be used as a mixed resin composition of the crystalline thermoplastic resin with mixture of a plurality of crystalline thermoplastic resin. Moreover, a mixed resin composition, where the crystalline thermoplastic resin and an amorphous thermoplastic resin such as polyetherimide (PEI) are mixed, may be used. Among them, when multi-stratifying metal laminated bodies each of which is obtained by laminating a metal layer on the white film of the present invention, it is preferable to use a resin composition which comprises: 80-20 mass % of a crystalline polyaryl ketone resin (A) having a crystal melting peak temperature of 260° C. or more; and 20-80 mass % of an amorphous polyetherimide resin (B). When using the resin composition, at a time of multi-stratifying, it is possible to make adhesiveness tighter between the metal laminated bodies.

In view of adhesiveness when multi-stratifying the metal laminated bodies, the mixing ratio of the polyaryl ketone resin and the amorphous polyetherimide resin will be described as below. The polyaryl ketone resin may be 20 mass % or more and 80 mass % or less and the remaining portion may be a mixed composition of the amorphous polyetherimide resin and inevitable impurities. The content rate of the polyaryl keton resin is more preferably 30 mass % or more and 75 mass % or less, particularly preferably 40 mass % or more and 70 mass % or less. By setting the upper limit of the content rate within the above range, it is possible to inhibit increase in crystallinity of the thermoplastic resin composition as a constituent of the white film and possible to inhibit decrease in adhesiveness at a time of multi-stratifying the metal laminated bodies. Moreover, by setting the lower limit of the content rate with respect to the polyaryl ketone resin, it is possible to inhibit decrease in crystallinity of the thermoplastic resin composition as a constituent of the white film; thereby it is possible to inhibit decrease in reflow thermal resistance of the multi-layered substrate.

The polyaryl ketone-based resin (A) is a thermoplastic resin containing, in its structural unit, an aromatic nucleus bond, an ether bond, and a ketone bond. Specific example thereof include: polyether ketone (glass transition temperature [hereinafter, refer to as "Tg".]: 157° C.; crystal melting peak temperature [hereinafter, refer to as "Tm".]: 373° C.), polyether ether ketone (Tg: 143° C.; Tm: 334° C.), and polyether ether ketone ketone (Tg: 153° C.; Tm: 370° C.). Among them, to improve thermal resistance, a thermoplastic resin which shows crystallinity and has Tm of 260° C. or more, particularly preferably 300-380° C. In the range which does not undermine the effect of the present invention, for instance, biphenyl structure, sulfonyl structure, and other repeating units may be contained.

Among the polyaryl ketone-based resin (A), a polyaryl ketone-based resin (A) containing a polyether ether ketone as the main component and having a repeating unit of the structural formula (1) is particularly preferably used. Here, the term "main component" means that the content exceeds 50 mass % of total. Examples of the commercially available polyether ether ketone may be "PEEK 151G" (Tg: 143° C.; Tm: 334° C.), "PEEK 381G" (Tg: 143° C.; Tm: 334° C.), and "PEEK 450G" (Tg: 143° C.; Tm: 334° C.); these are commodity names of products produced by Victrex plc. The polyaryl ketone-based resin (A) may be used alone or used in combination of two or more thereof.

(1)

The amorphous polyetherimide resin (B) may specifically be an amorphous polyetherimide resin containing the repeating units of the following structural formulas of (2) and (3).

mula (3) is particularly preferable. The polyetherimide resin (B) may be used alone or in combination of two or more thereof.

(Decreasing Rate in Reflectance)

The white film of the invention requires 10% or less of decreasing rate in reflectance at a wavelength of 470 nm after thermal treatment at 200° C. for 4 hours. Among them, 10% or less of decreasing rate in reflectance at a wavelength of 470 nm after thermal treatment at 260° C. for 5 minutes is preferable.

The support of the above conditions will be described as follows. In the manufacturing process of the LED-mounted substrate, there exist a high heat load environment such as: thermosetting process (100-200° C. for several hours) of sealant such as conductive adhesive, epoxy resin, and silicon resin; soldering process (Pb-free soldering reflow, peak temperature 260° C., several minutes); and wire-bonding process. In addition, even under actual use, with the development of highly bright LEDs, the heat load to the substrate tends to increase; thus, the peripheral temperature of the LED elements sometimes exceeds 100° C. The key for the development in the future is to maintain high reflectance with no discoloration under such a high heat load environment. The wavelength 470 nm is an average wavelength of blue LEDs.

Therefore, if the decreasing rate in reflectance at a wavelength of 470 nm after thermal treatment of the above conditions (i.e. 200° C. for 4 hours; or 260° C. for 5 minutes) is 10% or less, it is possible to inhibit decrease in reflectance during the manufacturing process and possible to inhibit decrease in reflectance during actual use; hence, the white film can be suitably used for making an LED-mounted substrate. It is more preferably 5% or less, furthermore preferably 5% or less, and particularly preferably 2% or less.

(Thickness of the White Film)

The thickness of the film of the invention is preferably 3-500 μm, more preferably 10-300 μm, particularly prefer- The amorphous polyetherimide resin having repeating units of the structural formulas (2) and (3) can be produced as a polycondensation product of 4,4'-[isopropylidene bis (p-phenyleneoxi)]diphthalic acid dianhydride with p-phenylene diamine or m-phenylene diamine by a known method. Examples of commercially available amorphous polyetherimide resin include: "ULTEM 1000" (Tg: 216° C.), "ULTEM 1010" (Tg: 216° C.), and "ULTEM CRS5001" (Tg: 226° C.), these are commodity names of products produced by General Electric Company. Among them, the amorphous polyetherimide resin having the repeating units of the structural forably 20-100 μm. Within the above range, the white film can be suitably used for chip LEDs used for back-lighting of a thinner-type cellular phone and a surface light source for back-lighting of liquid crystal display.

(Additives and so on)

To the thermoplastic resin composition constituting the white film of the invention, in the range which does not undermine the property, various additives apart from other resins and inorganic fillers, such as thermal stabilizer, ultraviolet absorber, light stabilizer, nucleating agent, coloring agent, lubricant, and flame retardant, may be adequately added. The method for preparing the thermoplastic resin composition of the invention is not specifically restricted; a known method can be used. For example, a method (a) comprising the steps of: preparing master batches by adding a highly-concentrated (typical content may be 10-60 mass %) various additives respectively to each adequate base resin such as polyaryl ketone resin and/or amorphous polyetherimide resin; adjusting the concentration of the individual master batches and then mixing with the resin to be used; finally, mechanically blending the mixture using a kneader or an extruder. Another example may be a method (b) where the various additives are directly mixed with resin to be used and the mixture is mechanically blended using a kneader or an extruder. In the above mixing methods, the method (a) firstly preparing master butches and then mixing is preferable in view of dispersiveness and workability. Moreover, to improve handleability and the like, the surface of the film may be treated with embossing or corona discharge.

(Method for Forming the White Film)

The method for forming the white film of the present invention may be a known method such as extrusion casting using T-die or calendaring; it is not particularly limited. In view of film-forming property and stable production of the sheet (film), extrusion casting using T-die is preferable. The forming temperature in extrusion casting using T-die is adequately adjusted depending on flow property and film-forming property of the composition; it is about the melting point or more and 430° C. or less. Also, when using a crystalline resin, the method for crystallization treatment to impart thermal resistance is not particularly limited; for example, there may be: a method of crystallization at a time of extrusion casting (namely, casting-crystallization); a method of crystallization by rolls for thermal treatment and hot-air oven in the film-forming line (in-line crystallization); and a method of crystallization by hot-air oven or hot press outside the film-forming line (namely, out-line crystallization).

<Metal Laminated Body>

The metal laminated body of the present invention is not particularly limited as long as it is a metal laminated body where metal layer(s) is(are) laminated on at least one surface of the white film. As the metal layer, for example, a metal foil made of copper, gold, silver, aluminum, nickel, or tin, each of which has a thickness of about 5-70 µm may be used. Among them, as the metal foil, copper foil is usually used; particularly, a copper foil of which surface is treated by chemical conversion such as black oxide treatment may be suitably used. To enhance its adhesive effect, the conductive foil is preferably the one where contact face (superposing face) of the foil to the film is made rough chemically or mechanically in advance; specific example of the surface-treated conductive foil may be a roughened copper foil which is electrochemically treated when producing electrolytic copper foil.

The lamination method of the metal foil may be a known method using heating or pressing as a heat-seal method without using adhesive layer; it is not particularly limited. For example, hot-pressing method, heat roll lamination method, extrusion lamination method by laminating an extruded resin using castroll, and the combination of these methods can be suitably adopted.

<LED-Mounted Substrate>

As the substrate for mounting LED of the present invention, it is not particularly limited as long as the substrate is composed of the metal laminated body; there may be a double-sided board or a composite substrate with an aluminum plate (metal radiator). Since conventional white substrate made of a thermosetting resin contains glass cloth, in the manufacturing process, there are problems such as remain of voids (bubbles) and difficulty to fabricate thinner products. Ceramic substrate also faces difficulty to fabricate thinner products due to its hard and brittle properties. However, by using the white film and the metal laminated body employing the white film of the present invention, it is possible to fabricate thinner product; these can be suitably used for a substrate for back-lighting of cellular phone which demands tough low-profile requirements. Moreover, as the filler, when adding various fillers (the filler 1 and the filler 2) each having a predetermined value of properties, it is possible to provide a double-sided board having good balance among reflective characteristics, dimensional stability, and stiffness.

Further, with development of highly bright LEDs, when higher exoergic property is required, it is possible to improve exoergic property by compositing with an aluminum plate (metal radiator). Examples of the structure regarding the composit substrate with an aluminum plate may be: a case where a metal laminated body employing the white film of the invention is laminated on the entire surface of an aluminum plate; or a case where a metal laminated body employing the white film of the invention is firstly punched out to form windows for cavity (concave) structure and then laminated. The aluminum plate to be used may desirably be roughened in view of adhesiveness with the thermoplastic resin; when considering cavity structure, mirror-finish aluminum plate is preferably used to efficiently reflect the light emitted from the LEDs. Moreover, to improve exoergic property, thinner film thickness is preferable. When using a film made of the thermoplastic resin composition of the invention, resin flow can be inhibited, shape of the cavity structure can be maintained, and it is possible to secure adhesion reliability even when using the mirror-finish aluminum plate.

Figure 1:
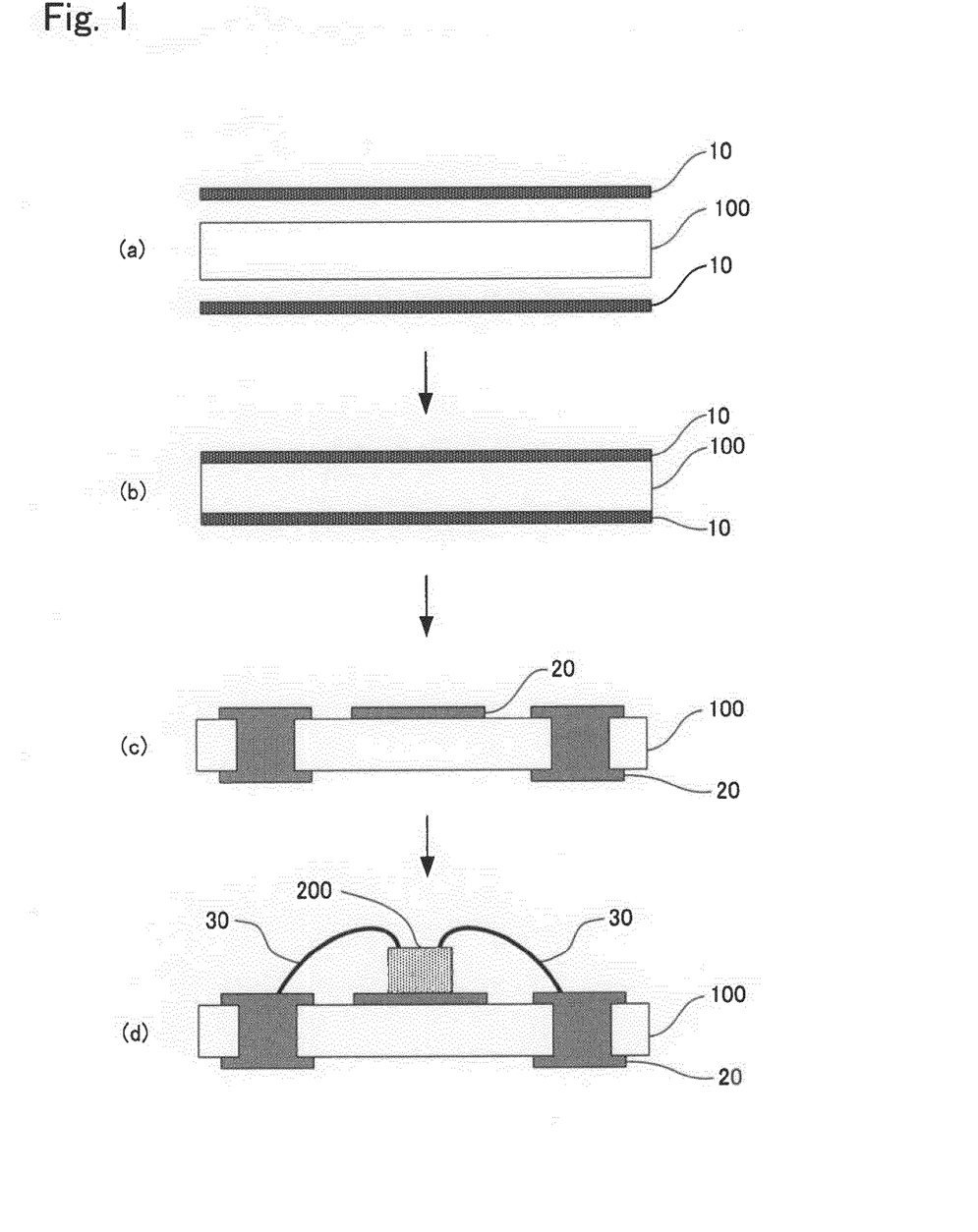
FIG. 1 is a plan showing an embodiment of a printed circuit boards for mounting LEDs of the present invention and the manufacturing method thereof.

The method for fabricating a substrate for mounting LEDs of the present invention is not particularly limited. In a case of double-sided board, for instance, it can be fabricated in accordance with the method of FIG. 1. As shown in FIG. 1, first of all, (a) a white film 100 and two copper foils 10 as the metal layer are prepared; (b) the copper foils 10 are laminated on both sides of the white film 100 by vacuum pressing to form a metal laminated body; and (c) the copper foils 10 are etched or plated thereon to form a wiring patterns 20, to provide a substrate for mounting LEDs. To the substrate, (d) an LED 200 is mounted and connected to the wiring pattern 20 through bonding wires 30, for actual operation (thus, LED-mounted substrate is completed.).

Figure 2:
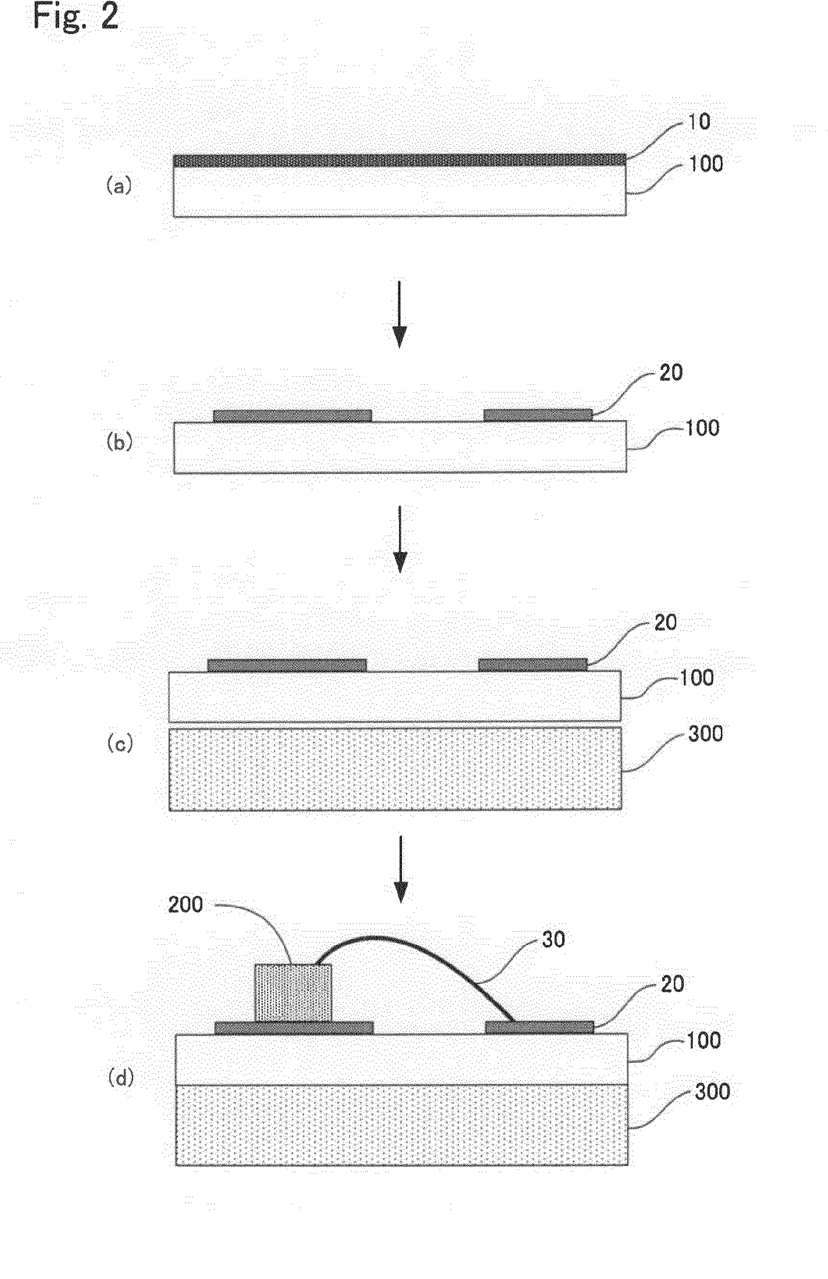
FIG. 2 is a plan showing another embodiment of a printed circuit boards for mounting LEDs of the invention and the manufacturing method thereof.

On the other hand, in a case of composite substrate with an aluminum plate (metal radiator), it can be fabricated, for example, in accordance with the methods shown in FIGS. 2 and 3. As shown in FIG. 2, (a) a copper foil 10 is laminated on one surface of the white film 100 to fabricate a metal laminated body; (b) a wiring pattern 20 is formed by etching the copper foil 10; and (c) an aluminum plate 300 is laminated by vacuum pressing on the surface of the white film 100 opposite to the surface where the wiring patterns 20 have been formed, to obtain a substrate for mounting LEDs. To the substrate, (d) an LED 200 is mounted and connected to the conductor patterns 20 through the bonding wires 30, for actual operation (hence, an LED-mounted substrate is completed.). It should be noted that the lamination method with the aluminum plate is not limited to vacuum pressing; for instance, substantially the same method as the lamination method of the metal foil may possibly be adopted.

Figure 3:
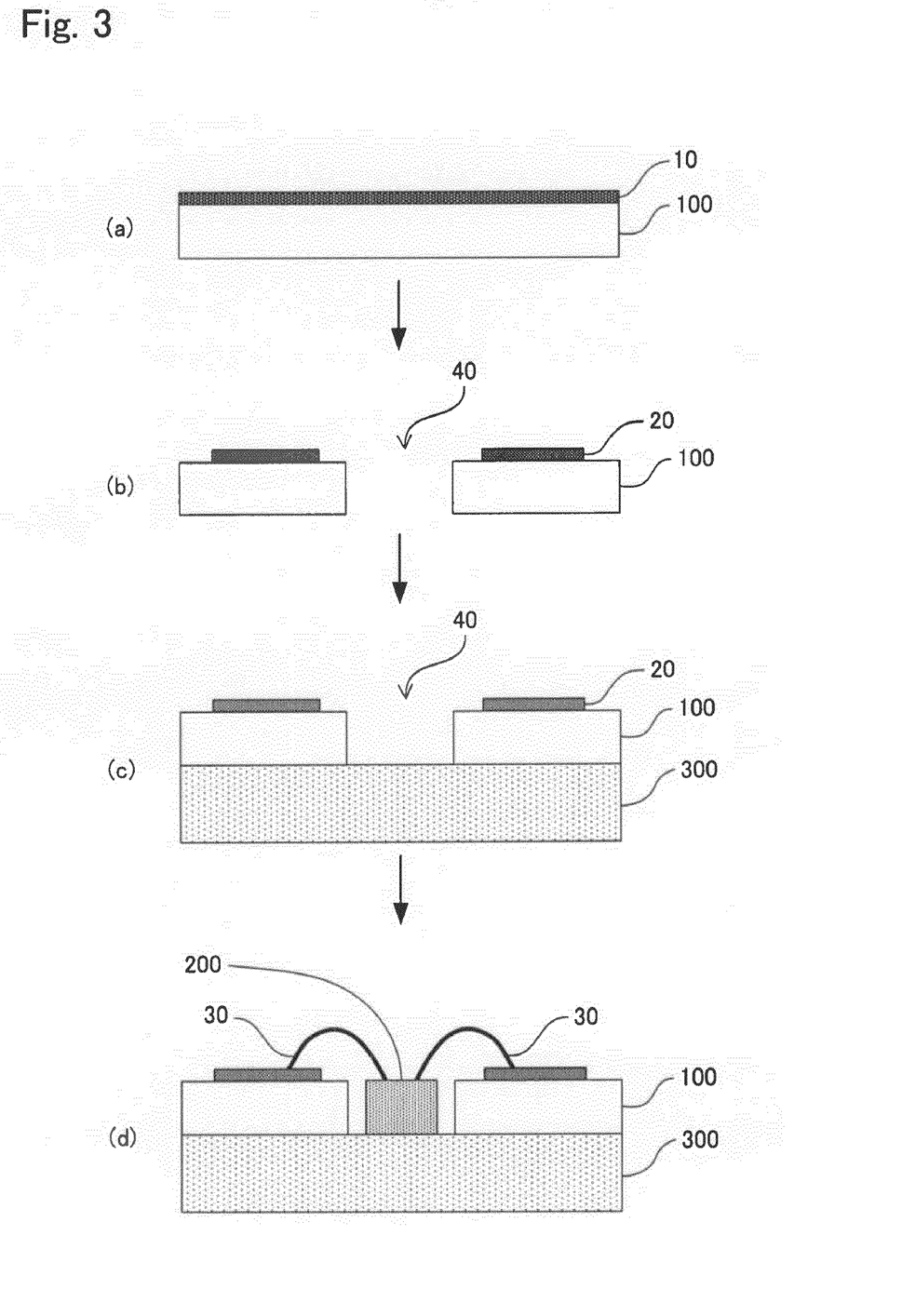
FIG. 3 is a plan showing another embodiment of a printed circuit boards for mounting LEDs of the invention and the manufacturing method thereof.

Further, as shown in FIG. 3, (a) a copper foil 10 is laminated on one surface of the white film 100 to fabricate a metal laminated body; (b) wiring patterns 20 are formed by etching the copper foil 10 and the white film 100 is punched out (40) using Thomson die cutter along cavity frame; and (c) an aluminum plate 300 is laminated by vacuum pressing on the surface of the white film 100 opposite to the surface where the wiring patterns 20 have been formed to obtain a substrate for mounting LED. To the substrate, (d) an LED 200 is mounted and connected to the wiring patterns 20 through bonding wires 30, for actual operation. It should be noted that the method for punching out along the cavity frame is not limited to the method using Thomson die cutter; for example, laser can be used.

EXAMPLES

Hereinafter, the present invention will be more specifically described by way of the following Examples and Comparative examples. However, the invention is not limited to the examples.

Values of various measurements about the film and so on of the invention were obtained and evaluated in accordance with the following description.

(Crystal Melting Peak Temperature (Tm))

Crystal melting peak temperature (Tm) was determined from a thermograph when heating 10 mg of a test sample at a heating rate of 10° C./min using differential scanning calorimeter (i.e. "DSC-7" manufactured by Perkin Elmer Inc.), in accordance with JIS K7121.

(Average Reflectance)

An integrating sphere was attached to a spectrophotometer (i.e. "U-4000" manufactured by Hitachi, Ltd.) and reflectance equivalent to the reflectance of alumina white board as 100% was measured through the wavelength range of 400-800 nm at 0.5 nm interval. The average of the measured value was calculated and the obtained average was defined as the average reflectance.

(Reflectance after Thermal Treatment)

The obtained white films were firstly thermally treated (crystallized) at a peak temperature of 260° C. for 30 minutes in a vacuum press apparatus, then, the thermally-treated films were independently thermally treated at 200° C. for 4 hours and at 260° C. for 5 minutes in each circulating hot air oven. Reflectance after thermal treatment was measured in the same manner as above, and reflectance at a wavelength of 470 nm was determined.

(Measurement of Linear Expansion Coefficient ($\times 10^{-6}$/° C.))

By using an apparatus for measuring thermal stress ("TMA/SS6100" manufactured by Seiko Instruments Inc.), strip-shape test pieces (10 mm long) cut out from the obtained film were fixed with 0.1 g of tensile loading and heated from 30° C. up to 300° C. at a heating rate of 5° C./min; then, temperature dependency of thermal expansivity in both MD ($\alpha 1(MD)$) and TD ($\alpha 1(TD)$) was measured through a time of cooling from 140° C. down to 30° C.

(Average Particle Diameter)

By using a specific surface area analyzer for powder (permeation method) (type "SS-100" manufactured by Shimadzu Corporation), 3 g of a test sample was filled in a test cylinder having a cross-sectional area of 2 cm$^2$ and a height of 1 cm and permeability time of 20 cc air was measured in a 500 mm high water column; then, average particle diameter of titanium oxide was calculated.

Example 1

A thermoplastic resin composition obtained by mixing: 100 parts by mass of a resin composition comprising 60 mass % of polyether ether ketone resin ("PEEK 450G", Tm=335° C.) and 40 mass % of amorphous polyetherimide resin ("ULTEM 1000"); 30 parts by mass of a titanium oxide (average particle diameter: 0.23 μm, treated with alumina and a silane coupling agent) produced by chlorine method; and 21 parts by mass of synthetic mica having an average particle diameter of 5 μm and an average aspect ratio of 50 was melt-kneaded. Then, the melt-kneaded thermoplastic resin composition was formed into a 100 μm thick film using an extruder having T-dies at a set temperature of 380° C. The evaluation results are shown in Table 1.

Example 2

Except for using a resin mixture comprising: 40 mass % of polyether ether ketone resin ("PEEK 450G", Tm=335° C.); and 60 mass % of amorphous polyetherimide resin ("ULTEM 1000"), Example 2 was carried out in the same manner as Example 1 to produce a 100 μm thick film. The evaluation results are shown in Table 1.

Example 3

Except for using a thermoplastic resin composition obtained by mixing: 35 parts by mass of titanium oxide; and 30 parts by mass of a synthetic mica having an average particle diameter of 5 μm and an average aspect ratio of 50, Example 3 was carried out in the same manner as Example 1 to produce a 100 μm thick film. The evaluation results are shown in Table 1.

Example 4

Except for using a thermoplastic resin composition obtained by mixing: 25 parts by mass of titanium oxide; and 15 parts by mass of a synthetic mica having an average particle diameter of 5 μm and an average aspect ratio of 50, Example 4 was carried out in the same manner as Example 1 to produce a 100 μm thick film. The evaluation results are shown in Table 1.

Example 5

Except for using a resin composition consisting of 100 mass % of a polyether ether ketone resin ("PEEK 450G", Tm=335° C.), Example 5 was carried out in the same manner as Example 1 to produce a 100 μm thick film. The evaluation results are shown in Table 1.

Example 6

A film having a thickness of 30 μm was produced in the same manner as Example 1. The evaluation results are shown in Table 1.

Example 7

Except for using a thermoplastic resin composition obtained by mixing: 15 parts by mass of titanium oxide; and 20 parts by mass of synthetic mica having an average particle diameter of 5 μm and an average aspect ratio 50, Example 7 was carried out in the same manner as Example 1 to produce a 100 μm thick film. The evaluation results are shown in Table 1.

Example 8

Except for using a thermoplastic resin composition obtained by mixing: 15 parts by mass of titanium oxide; and 30 parts by mass of a synthetic mica having an average particle diameter of 5 μm and an average aspect ratio of 50, Example 8 was carried out in the same manner as Example 1 to produce a 100 μm thick film. The evaluation results are shown in Table 1.

Example 9

Except for using titanium oxide (average particle diameter: 0.5 μm, treated with alumina and silica, no treatment with organic surfactants) produced by chlorine method, Example 9 was carried out in the same manner as Example 1 to produce a 100 μm thick film. The evaluation results are shown in Table 1.

Example 10

Except for using titanium oxide (average particle diameter: 0.23 μm, treated with alumina and polyol) produced by chlorine method, Example 10 was carried out in the same manner as Example 1 to produce a 100 μm thick film. The evaluation results are shown in Table 1.

Example 11

Except for using a thermoplastic resin composition obtained by mixing: 16 parts by mass of titanium oxide; and 45 parts by mass of a synthetic mica having an average particle diameter of 5 μm and an average aspect ratio of 50, Example 11 was carried out in the same manner as Example 1 to produce a 100 μm thick film. The evaluation results are shown in Table 1.

Example 12

A substantially the same thermoplastic resin composition as that of Example 1 was melt-kneaded; the melt-kneaded resin composition was extruded and simultaneously laminated with a 12 μm thick copper foil from one side of the extruded resin film to produce a film having a 100 μm thick resin film and a 12 μm thick copper foil laminated on one surface of the resin film. The evaluation results are shown in Table 1. The entire surface of the one-sided copper foil was etched; then, the resultant laminated body was measured in the same manner as Example 1. It should be noted that the reflectance was measured at the etched side.

Example 13

A 100 μm film was produced in the same manner as Example 1; thereafter, by using a vacuum press apparatus at a peak temperature of 260° C., a holding time of 30 minutes, and a pressure of 5 MPa, a double copper foil-laminated film where 12 μm thick copper foils were laminated on each side of the 100 μm thick resin film was produced. The entire surface of the copper foils laminated on both sides of the film was etched; then, the resultant was measured in the same manner as Example 1.

Example 14

The metal laminated body (one-side copper laminated film) of Example 12 was etched and then punched out along the cavity frame to form holes for cavity. The resultant laminated body was laminated with a mirror-finish aluminum plate using a vacuum press apparatus at 280° C. and a pressure of 5 MPa for 30 minutes to produce a substrate for mounting LEDs. When moisturizing the obtained substrate in a PCT (Pressure Cooker Tester) at a temperature of 121° C. and a pressure of 2 atmospheric pressure for 2 hours, followed by immersing in a solder bath heated at a predetermined temperature for 20 seconds, no swelling was observed even at 240° C. or more, the adhesiveness between the mirror-finished aluminum and the metal laminated body was favorable.

Comparative Example 1

Except for using a thermoplastic resin composition obtained by mixing 20 parts by mass of titanium oxide, Comparative example 1 was carried out in the same manner as Example 1 to produce a 100 μm thick film. The evaluation results are shown in Table 1.

Comparative Example 2

Except for using a thermoplastic resin composition obtained by mixing 20 parts by mass of a synthetic mica having an average particle diameter of 5 μm and an average aspect ratio of 50, Comparative example 2 was carried out in the same manner as Example 1 to produce a 100 μm thick film. The evaluation results are shown in Table 1.

Comparative Example 3

Except for using a thermoplastic resin composition obtained by mixing 67 parts by mass of titanium oxide, Comparative example 3 was carried out in the same manner as Example 1 to produce a 100 μm thick film. The evaluation results are shown in Table 1.

Comparative Example 4

Except for using a thermoplastic resin composition obtained by mixing 39 parts by mass of a synthetic mica having an average particle diameter of 5 μm and an average aspect ratio of 50, Comparative example 4 was carried out in the same manner as Example 1 to produce a 100 μm thick film. The evaluation results are shown in Table 1.

Comparative Example 5

Except for using a thermoplastic resin composition obtained by mixing 15 parts by mass of titanium oxide and 30 parts by mass of potassium titanate fiber (fiber length: 6 μm, fiber diameter: 0.5 μm), Comparative example 5 was carried out in the same manner as Example 1 to produce a 100 μm thick film. The evaluation results are shown in Table 1.

TABLE 1

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Thermoplastic resin | PEEK | 60 | 40 | 60 | 60 | 100 | 60 | 60 | 60 | 60 | 60 |
| | PEI | 40 | 60 | 40 | 40 | | 40 | 40 | 40 | 40 | 40 |
| Inorganic filler | Titanium oxide | 30 | 30 | 35 | 25 | 30 | 30 | 15 | 15 | 30 | 30 |
| | Mica Potassium titanate | 21 | 21 | 30 | 15 | 21 | 21 | 20 | 30 | 21 | 21 |
| Film thickness | | 100 | 100 | 100 | 100 | 100 | 30 | 100 | 100 | 100 | 100 |
| Reflectance (%) (400-800 nm) | | 80 Good | 80 Good | 81 Good | 78 Good | 81 Good | 74 Good | 73 Good | 73 Good | 79 Good | 78 Good |
| Reflectance after Thermal treatment (%) (470 nm) | Before Thermal treatment | 76 | 76 | 77 | 74 | 76 | 74 | 70 | 70 | 74 | 73 |
| | 200° C. for 4 hrs | 75 Good | 75 Good | 76 Good | 72 Good | 75 Good | 72 Good | 68 Good | 68 Good | 72 Good | 71 Good |
| | 260° C. for 5 mins | 75 Good | 75 Good | 76 Good | 72 Good | 75 Good | 71 Good | 68 Good | 68 Good | 71 Good | 71 Good |
| Linear Expansion Coefficient | MD | 24 | 25 | 22 | 29 | 24 | 25 | 23 | 22 | 24 | 24 |
| | TD | 34 | 34 | 30 | 39 | 35 | 35 | 32 | 30 | 34 | 34 |
| | Average | 29 Good | 29.5 Good | 26 Good | 34 Good | 29.5 Good | 30 Good | 27.5 Good | 26 Good | 29 Good | 29 Good |

| | | Example 11 | Example 12 | Example 13 | Comparative example 1 | Comparative example 2 | Comparative example 3 | Comparative example 4 | Comparative example 5 |
|---|---|---|---|---|---|---|---|---|---|
| Thermoplastic resin | PEEK | 60 | 60 | 60 | 60 | 60 | 60 | 60 | 60 |
| | PEI | 40 | 40 | 40 | 40 | 40 | 40 | 40 | 40 |
| Inorganic filler | Titanium oxide | 16 | 30 | 30 | 20 | | 67 | | 15 |
| | Mica Potassium titanate | 45 | 21 | 21 | | 20 | | 39 | 30 |
| Film thickness | | 100 | 100 | 100 | 100 | 100 | 100 | 100 | 100 |
| Reflectance (%) (400-800 nm) | | 73 Good | 81 Good | 81 Good | 80 Good | 40 Bad | 83 Good | 41 Bad | 71 Good |
| Reflectance after Thermal treatment (%) (470 nm) | Before Thermal treatment | 71 | 76 | 76 | 79 | 38 | 80 | 39 | 67 |
| | 200° C. for 4 hrs | 70 Good | 75 Good | 75 Good | 78 Good | 36 Good | 79 Good | 38 Good | 65 Good |
| | 260° C. for 5 mins | 70 Good | 75 Good | 75 Good | 77 Good | 35 Good | 79 Good | 38 Good | 65 Good |
| Linear Expansion Coefficient | MD | 19 | 24 | 23 | 40 | 27 | 38 | 19 | 23 |
| | TD | 27 | 34 | 34 | 65 | 36 | 58 | 26 | 57 |
| | Average | 23 Good | 29 Good | 28.5 Good | 52.5 Bad | 31.5 Good | 48 Bad | 22.5 Good | 40 Bad |

As seen from the results of Table 1, with regard to Examples 1 to 14, a white film, a metal laminated body, and a substrate for mounting LEDs, each of which exhibits favorable reflectance characteristics and dimensional stability, and small decrease in reflectance after thermal test, could be obtained. On the other hand, in the cases of Comparative examples 1, 3, and 5, since the linear expansion coefficient in the MD and TD is out of the predetermined range, these films were poor in dimensional stability; among them, in the case of Comparative example 5, although the linear expansion coefficient in the MD was largely reduced due to the usage of anisotropic inorganic filler, the linear expansion coefficient in the TD was high, thereby the dimensional stability was poor. Moreover, in the cases of Comparative examples 2 and 4, since the reflectance is out of the predetermined range, white films which can be used for a substrate material suitable for mounting LEDs and the like could not be obtained for both cases.

Whereas, it has discovered that the metal laminated body and the metal composite substrate of the present invention can be suitably used for a substrate for mounting LEDs.

Industrial Applicability

The white film of the present invention and the metal laminated body employing the white film can be used as an LED-mounted substrate by mounting thereon LEDs (Light Emitting Diode) and so on.

The invention claimed is:

1. A metal laminated body comprising:
   a white film; and
   a metal layer being laminated on at least one surface of the white film,
   wherein the white film comprises a thermoplastic resin composition comprising 25-100 parts by mass of an inorganic filler, based on 100 parts by mass of the thermoplastic resin, and has:
   an average reflectance of 70% or more at a wavelength of 400-800 nm;
   an average linear expansion coefficient of $35 \times 10^{-6}$/° C. or less in the machine direction and the transverse direction; and
   a decreasing rate in reflectance of 10% or less at a wavelength of 470 nm after thermal treatment at 200° C. for 4 hours.

2. The metal laminated body according to claim 1, wherein the inorganic filler comprises at least one filler having an average particle diameter of 15 μm or less and an average aspect ratio of 30 or more.

3. The metal laminated body according to claim 1, wherein the inorganic filler comprises, based on 100 parts by mass of the thermoplastic resin:
- 10-85 parts by mass of a first filler having an average particle diameter of 15 μm or less and an average aspect ratio of 30 or more; and
- 15-90 parts by mass of a second filler having a refractive index of 1.6 or more.

4. The metal laminated body according to claim 3, wherein the second filler is titanium oxide.

5. The metal laminated body according to claim 1, wherein the thermoplastic resin comprises at least one selected from the group consisting of a crystalline thermoplastic resin of which crystal melting peak temperature is 260° C. or more, and an amorphous thermoplastic resin of which glass transition temperature is 260° C. or more.

6. The metal laminated body according to claim 1, wherein the thickness of the white film is 3-500 μm.

7. The metal laminated body according to claim 1, wherein the decreasing rate in reflectance of the white film at a wavelength of 470 nm after thermal treatment at 260° C. for 5 minutes is 10% or less.

8. An LED-mounted substrate comprising the metal laminated body according to claim 1.

9. An LED-mounted substrate according to claim 8, wherein the metal laminated body is punched out along a cavity frame.

10. An LED-mounted substrate comprising:
- a metal laminated body according to claim 1;
- a metal radiator; and
- at least one LED,
- the metal layer in the metal laminated body being provided in a form of wiring pattern,
- the wiring pattern and the at least one LED being connected to each other, and
- the metal radiator being connected to a surface of the white film opposite to the surface where the wiring pattern is formed.

11. A white film comprising a thermoplastic resin composition comprising 25-100 parts by mass of an inorganic filler based on 100 parts by mass of a thermoplastic resin,
- wherein the average reflectance at a wavelength of 400-800 nm is 70% or more,
- the average linear expansion coefficient in the machine direction and the transverse direction is $35\times10^{-6}$/° C. or less, and
- the decreasing rate in reflectance at a wavelength of 470 nm after thermal treatment at 200° C. for 4 hours is 10% or less.

12. The white film according to claim 11, wherein the inorganic filler comprises at least one filler having an average particle diameter of 15 μm or less and an average aspect ratio of 30 or more.

13. The white film according to claim 11, wherein the inorganic filler comprises, based on 100 parts by mass of the thermoplastic resin:
- 10-85 parts by mass of a first filler having an average particle diameter of 15 μm or less and an average aspect ratio of 30 or more; and
- 15-90 parts by mass of a second filler having a refractive index of 1.6 or more.

14. The white film according to claim 13, wherein the second filler is titanium oxide.

15. The white film according to any claim 11, wherein the thermoplastic resin comprises at least one selected from the group consisting of a crystalline thermoplastic resin of which crystal melting peak temperature is 260° C. or more, and an amorphous thermoplastic resin of which glass transition temperature is 260° C. or more.

16. The white film according to claim 11, wherein the thickness of the film is 3-500 μm.

17. The white film according to claim 11, wherein the decreasing rate in reflectance at a wavelength of 470 nm after thermal treatment at 260° C. for 5 minutes is 10% or less.

* * * * *